(12) United States Patent
Xie et al.

(10) Patent No.: US 10,833,198 B2
(45) Date of Patent: Nov. 10, 2020

(54) CONFINED SOURCE DRAIN EPITAXY TO REDUCE SHORTS IN CMOS INTEGRATED CIRCUITS

(71) Applicant: INTERNATIONAL BUSINESS MACHINES CORPORATION, Armonk, NY (US)

(72) Inventors: Ruilong Xie, Niskayuna, NY (US); Chun-Chen Yeh, Danbury, CT (US); Lan Yu, Voorheesville, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/353,346

(22) Filed: Mar. 14, 2019

(65) Prior Publication Data
US 2020/0295200 A1 Sep. 17, 2020

(51) Int. Cl.
*H01L 21/768* (2006.01)
*H01L 29/786* (2006.01)
*H01L 29/78* (2006.01)
*H01L 29/66* (2006.01)
*H01L 21/8238* (2006.01)

(52) U.S. Cl.
CPC ........... *H01L 29/78618* (2013.01); *H01L 21/823814* (2013.01); *H01L 21/823821* (2013.01); *H01L 29/66636* (2013.01); *H01L 29/785* (2013.01); *H01L 29/7869* (2013.01)

(58) Field of Classification Search
CPC ............. H01L 21/76805; H01L 21/76808
See application file for complete search history.

(56) References Cited

U.S. PATENT DOCUMENTS

| | | | |
|---|---|---|---|
| 6,303,450 B1 | 10/2001 | Park et al. |
| 6,946,350 B2 | 9/2005 | Lindert et al. |
| 7,368,358 B2 | 5/2008 | Ouyang et al. |
| 7,582,516 B2 | 9/2009 | Dyer et al. |
| 8,148,780 B2 | 4/2012 | Tang et al. |
| 8,362,575 B2 | 1/2013 | Kwok et al. |
| 8,653,599 B1 | 2/2014 | Cheng et al. |
| 9,484,348 B2 | 11/2016 | Basker et al. |
| 10,056,383 B2 | 8/2018 | Lin et al. |

(Continued)

FOREIGN PATENT DOCUMENTS

| CN | 0088604 B | 3/2012 |
|---|---|---|
| WO | 0246439 A2 | 6/2002 |

*Primary Examiner* — Thomas L Dickey
(74) *Attorney, Agent, or Firm* — Tutunjian & Bitetto, P.C.; L. Jeffrey Kelly (57) ABSTRACT

A method is presented for limiting lateral protrusion of neighboring epitaxial growths. The method includes masking an n-type field effect transistor (NFET) region of a semiconductor substrate with a first mask, forming first epitaxial source/drain regions in a p-type field effect transistor (PFET) region, where the first mask limits lateral growth of the first epitaxial source/drain regions in the PFET region toward the NFET region, masking the PFET region of the semiconductor substrate with a second mask, and forming second epitaxial source/drain regions in the NFET region, where the second mask limits lateral growth of the second epitaxial source/drain regions in the NFET region toward the PFET region.

16 Claims, 10 Drawing Sheets

(56) References Cited

U.S. PATENT DOCUMENTS

| | | |
|---|---|---|
| 2004/0067506 A1 | 4/2004 | Scheres et al. |
| 2012/0007097 A1 | 1/2012 | Herbert |
| 2018/0277541 A1* | 9/2018 | Gluschenkov ........ H01L 27/092 |
| 2018/0350985 A1 | 12/2018 | Dasgupta et al. |

* cited by examiner

CONFINED SOURCE DRAIN EPITAXY TO REDUCE SHORTS IN CMOS INTEGRATED CIRCUITS

BACKGROUND

The present invention relates generally to semiconductor devices, and more specifically, to confined source drain epitaxy to reduce shorts in complementary metal oxide semiconductor (CMOS) integrated circuits (ICs).

As the dimensions of modern integrated circuitry in semiconductor chips continue to shrink, conventional semiconductor processing is increasingly challenged to make structures at finer dimensions. Planar field effect transistor (FET) technology has become constrained at smaller geometries due to leakage effects. The semiconductor industry has found an alternative approach to planar FETs with fin field effect transistors (FinFETs) to reduce leakage current in semiconductor devices. In a FinFET, an active region including the drain, the channel region and the source protrudes up from the surface of the semiconductor substrate upon which the FinFET is located. Due to the many superior attributes, especially in the areas of device performance, off-state leakage and foot print, FinFETs are replacing planar FETs, to enable the scaling of gate lengths to 14 nm and below.

SUMMARY

In accordance with an embodiment, a method is provided for limiting lateral protrusion of neighboring epitaxial growths. The method includes masking an n-type field effect transistor (NFET) region of a semiconductor substrate with a first mask, forming first epitaxial source/drain regions in a p-type field effect transistor (PFET) region, where the first mask limits lateral growth of the first epitaxial source/drain regions in the PFET region toward the NFET region, masking the PFET region of the semiconductor substrate with a second mask, and forming second epitaxial source/drain regions in the NFET region, where the second mask limits lateral growth of the second epitaxial source/drain regions in the NFET region toward the PFET region.

In accordance with another embodiment, a method is provided for increasing epitaxy to epitaxy spacing. The method includes depositing a first spin-on carbon (SOC) mask over an n-type field effect transistor (NFET) region of a semiconductor substrate, recessing a first set of fins in the p-type field effect transistor (PFET) region, growing first epitaxial source/drain regions over the PFET region such that a distal end of the first epitaxial source/drain regions defines a flattened surface resulting from contact with the first SOC mask, removing the first SOC mask, depositing a second SOC mask over PFET region of the semiconductor substrate, recessing a second set of fins in the NPFET region, growing second epitaxial source/drain regions over the NFET region such that a distal end of the second epitaxial source/drain regions defines a flattened surface resulting from contact with the second SOC mask, and removing the second SOC mask.

In accordance with yet another embodiment, a semiconductor structure is provided for increasing epitaxy to epitaxy spacing. The semiconductor structure includes an NFET transistor positioned adjacent to a PFET nanosheet transistor on a substrate, wherein source/drain epitaxial regions of the NFET transistor are adjacent to source/drain epitaxial regions of the PFET nanosheet transistor, wherein the source/drain epitaxial regions of the NFET transistor are truncated on a side facing the PFET nanosheet transistor such that the truncated face is substantially perpendicular to a top surface of the substrate, and wherein the source/drain epitaxial regions of the PFET nanosheet transistor are truncated on a side facing the NFET transistor such that the truncated face is substantially perpendicular to the top surface of the substrate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing a mask, rather than a dielectric liner, as an n-type field effect transistor (NFET) and p-type field effect transistor (PFET) source/drain epitaxy separating medium. The separating medium or mask can be, e.g., a spin-on carbon (SOC) mask. The separating medium or mask can physically limit the lateral protrusion of the respective epitaxy into the neighboring area and reduce or eliminate the possibility for epitaxy to epitaxy shorts. The source/drain epitaxy separating medium can be used in fin field effect transistors (FinFETs), as well as in nanosheet technology and at other complementary metal oxide semiconductor (CMOS) integration flows where tight dimensions demand close source/drain (S/D) epitaxy.

Strain is used in FET channel design in order to increase both electron and hole mobility, which leads to improved chip performance. Strain occurs when lattice mismatching is induced by the epitaxial growth of a first semiconductor material onto a second semiconductor material with a different composition of matter than the first semiconductor material. In the case of FinFET design, channel strain is induced by the epitaxial growth of different alloys of silicon germanium on top of each other. However, the strain that is created from the epitaxial layer growth is often lost after the end fin cut in the fin process module, which is performed prior to gate formation. In some cases, the strain loss is 30-50%. In addition to the issue of strain loss, excessive lateral source-drain epitaxial growth can cause shorts between the negative field-effect transistor (NFET) fin and the positive field-effect transistor (PFET) fin devices. Controlling the lateral epitaxial growth for a gate pitch of less than 64 nm can be challenging.

Embodiments in accordance with the present invention provide methods and devices employing techniques for effectively controlling the lateral epitaxial growth by using spin-on carbon (SOC) masks. The SOC masks clip off a distal end of the epitaxial growths such that a truncated or flattened profile is defined. The SOC masks thus limit lateral growth of epitaxial source/drain regions, which in turn, increases epitaxy to epitaxy spacing and reduces or eliminates epitaxy to epitaxy shorts.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), phosphorous doped silicon (Si:P), boride doped silicon germanium (SiGe:B), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
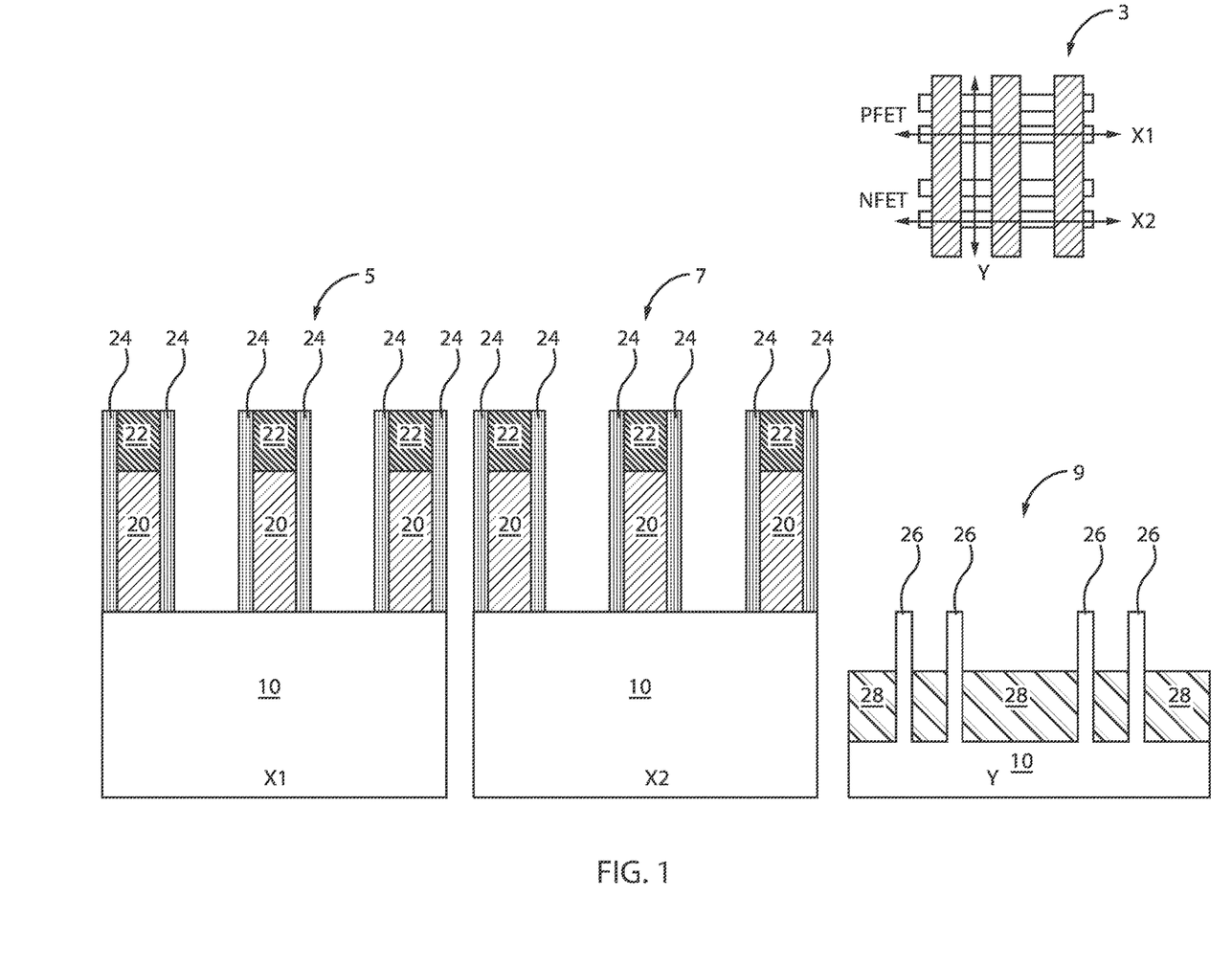
FIG. 1 is a cross-sectional view of a semiconductor structure including dummy gates formed between spacers and over a substrate, the semiconductor structure defining a p-type field effect transistor (PFET) region and an n-type field effect transistor (NFET) region, in accordance with an embodiment of the present invention.

FIG. 1 is a cross-sectional view of a semiconductor structure including dummy gates formed between spacers and over a substrate, the semiconductor structure defining a p-type field effect transistor (PFET) region and an n-type field effect transistor (NFET) region, in accordance with an embodiment of the present invention.

In structures 5 and 7, a plurality of dummy gates 20 can be formed over a substrate 10. A hardmask 22 can be formed over and in direct contact with the dummy gates 20. Spacers 24 can be formed adjacent the dummy gates 20 and the hardmasks 22.

Structure 5 is a cross-sectional view taken along line X1 of top view 3, whereas structure 7 is a cross-sectional view taken along line X2 of top view 3. The top portion of top view 3 illustrates the PFET region and the bottom portion of top view 3 illustrates the NFET region. Additionally, structure 9 is a cross-sectional view taken along line Y of top view 3. Structure 9 depicts both the PFET region and the NFET region. The PFET region depicts a first set of fins 26 and the NFET region depicts a second set of fins 26. The first set of fins 26 of the PFET region are separated from the second set of fins 26 of the NFET region by shallow trench isolation (STI) regions 28.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

Dummy gate 20 materials include, but are not limited to, any one or more of amorphous or polycrystalline Si, SiO$_2$, SiON, SiGe, Ge, GeO$_2$, amorphous C, BC, CN, etc. The hardmask 22 materials can include any one or more of SiN, SiCN, SiBN and/or SiBCN, among other materials. Further, spacers 24 can include any one or more of SiN, SiBN, SiCN and/or SiBCN films. STI regions 28 can be formed in the substrate 10 to electrically isolate regions of adjacent semiconductor devices that are formed over the substrate 10. STI regions 28 can include oxide (STI oxide).

The fins 26 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The fins 26 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

Figure 2:
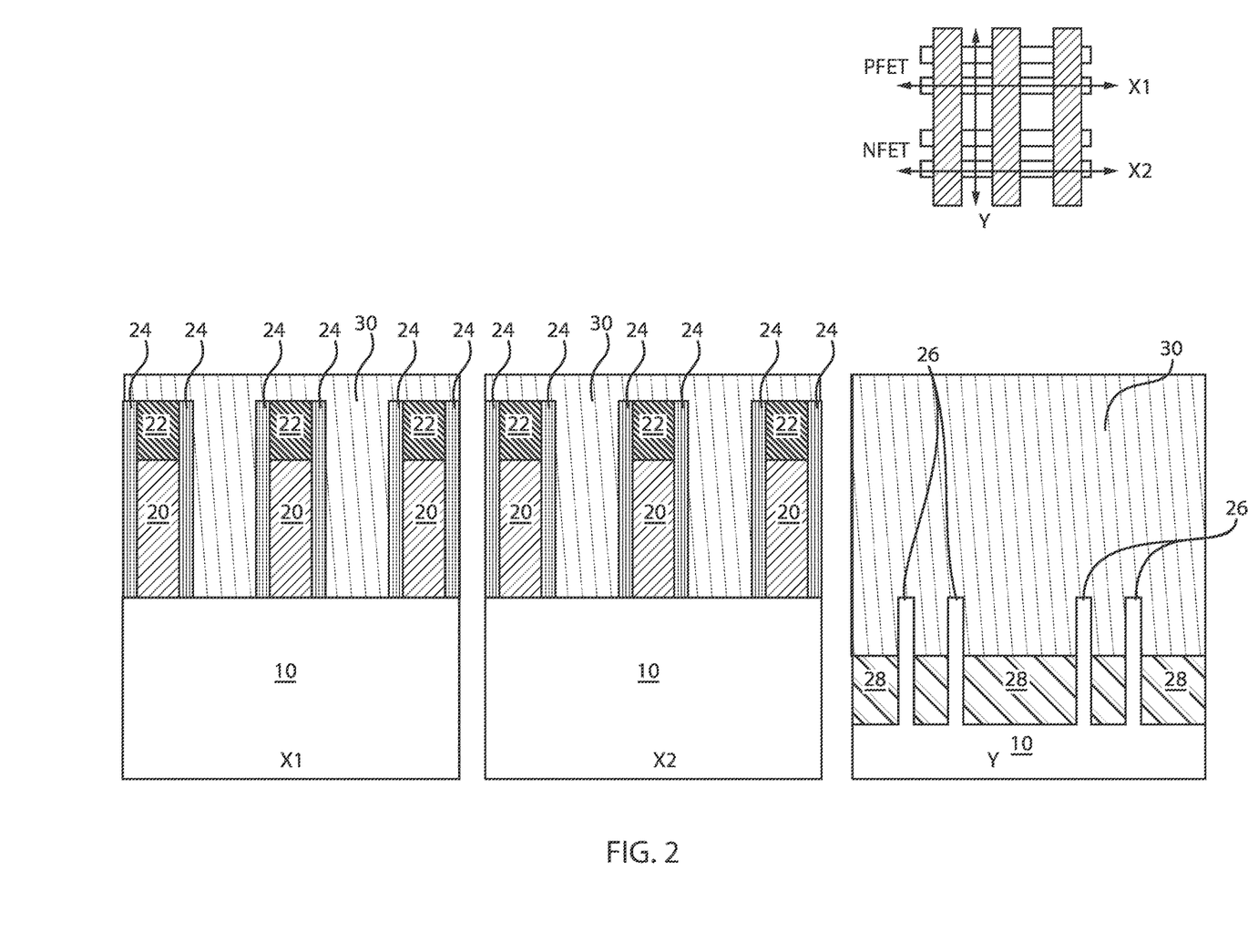
FIG. 2 is a cross-sectional view of the semiconductor structure of FIG. 1 where a first mask is deposited and planarized, in accordance with an embodiment of the present invention.

FIG. 2 is a cross-sectional view of the semiconductor structure of FIG. 1 where a first mask is deposited and planarized, in accordance with an embodiment of the present invention.

In various example embodiments, a first mask 30 is deposited and planarized. The first mask 30 can be, e.g., a spin-on carbon (SOC) mask. The first mask 30 is a patterning material that can be removed by, e.g., an ash process. Additionally, the first mask 30 is compatible with high temperature processes, such as epitaxy.

Silicon and carbon hard masks have been used for multilayer processes in advanced lithography. These hard masks are conventionally prepared by chemical vapor deposition (CVD). A spin-on carbon hard mask (SOC HM) has been used in semiconductor manufacturing processes since the 45 nm node. Compared to the conventional chemical vapor deposition process, a spin-on process provides lower cost of ownership, less defectivity and better alignment accuracy. In addition, SOC can provide good gap filling and planarization performance for severe topography depending on the SOC morphology and viscosity.

SOC hardmasks are an increasingly key component of the micro-chip fabrication process. They are employed to improve the resists' selectivity to silicon during plasma etching. Furthermore, as chip architectures become increasingly complex the use of hardmasks to improve the aspect ratio of features in silicon is important. In this context, the "aspect ratio" is the ratio between the height of a feature on a silicon wafer and its width. For many emerging multi-layer chip architectures, such as tri-layer etch-stacks, a large height to width ratio is needed to maintain small lateral features across multiple vertical layers.

The planarizing process can include chemical mechanical polishing (CMP) followed by an etch process. Therefore, the planarization process can be provided by CMP. Other planarization processes can include grinding and polishing.

Figure 3:
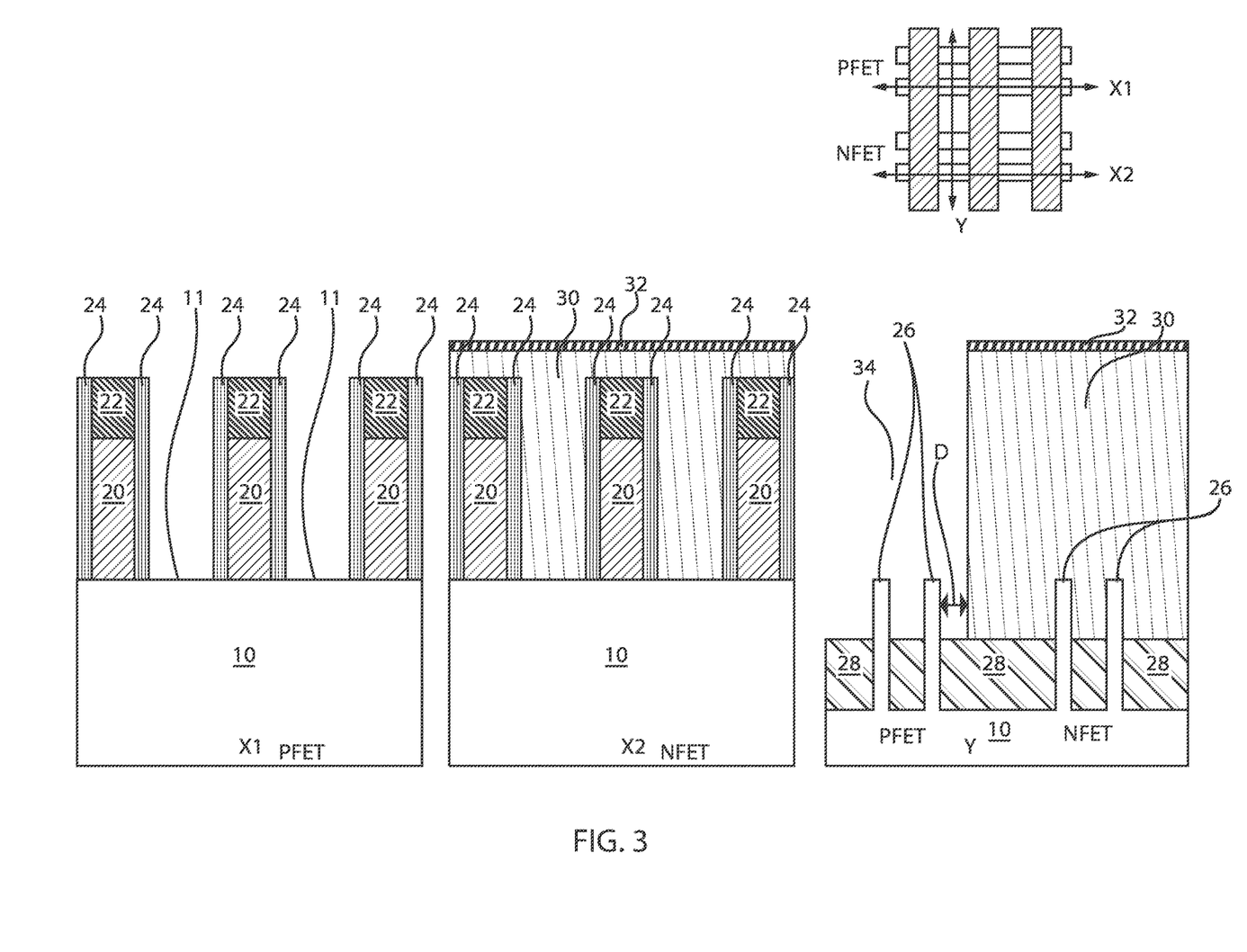
FIG. 3 is a cross-sectional view of the semiconductor structure of FIG. 2 where a first encapsulation layer is deposited over the NFET region and the first mask is etched in the PFET region to expose a first set of fins in the PFET region, in accordance with an embodiment of the present invention.

FIG. 3 is a cross-sectional view of the semiconductor structure of FIG. 2 where a first encapsulation layer is deposited over the NFET region and the first mask is etched in the PFET region to expose a first set of fins in the PFET region, in accordance with an embodiment of the present invention.

In various example embodiments, a first encapsulation layer 32 is deposited over the NFET region and the first mask 30 is etched in the PFET region to expose a first set of fins 26 in the PFET region 34.

The first encapsulation layer 32 can be, e.g., a titanium oxide ($TiO_x$) layer.

In the view taken along axis X1, the spacers 24 are exposed, as well as a top surface 11 of substrate 10 due to the etching in the PFET region.

In the view taken along axis X2, the first encapsulation layer 32 is shown over the first mask 30.

In the view taken along axis Y, the first set of fins 26 in the PFET region 34 are exposed. The rightmost fin of the first set of fins 26 is separated from the first mask 30 in the NFET region by a distance "D." The distance "D" can be about 8 nm to about 16 nm.

Recessing can be performed by, e.g., dry etch processing. In one example, a dry etch can be employed, such as, but not limited to, a directional reactive ion etch (RIE) process with chemistry such as chlorine gas ($Cl_2$)+hydrogen bromide (HBr)+argon (Ar)+oxygen gas ($O_2$).

Figure 4:
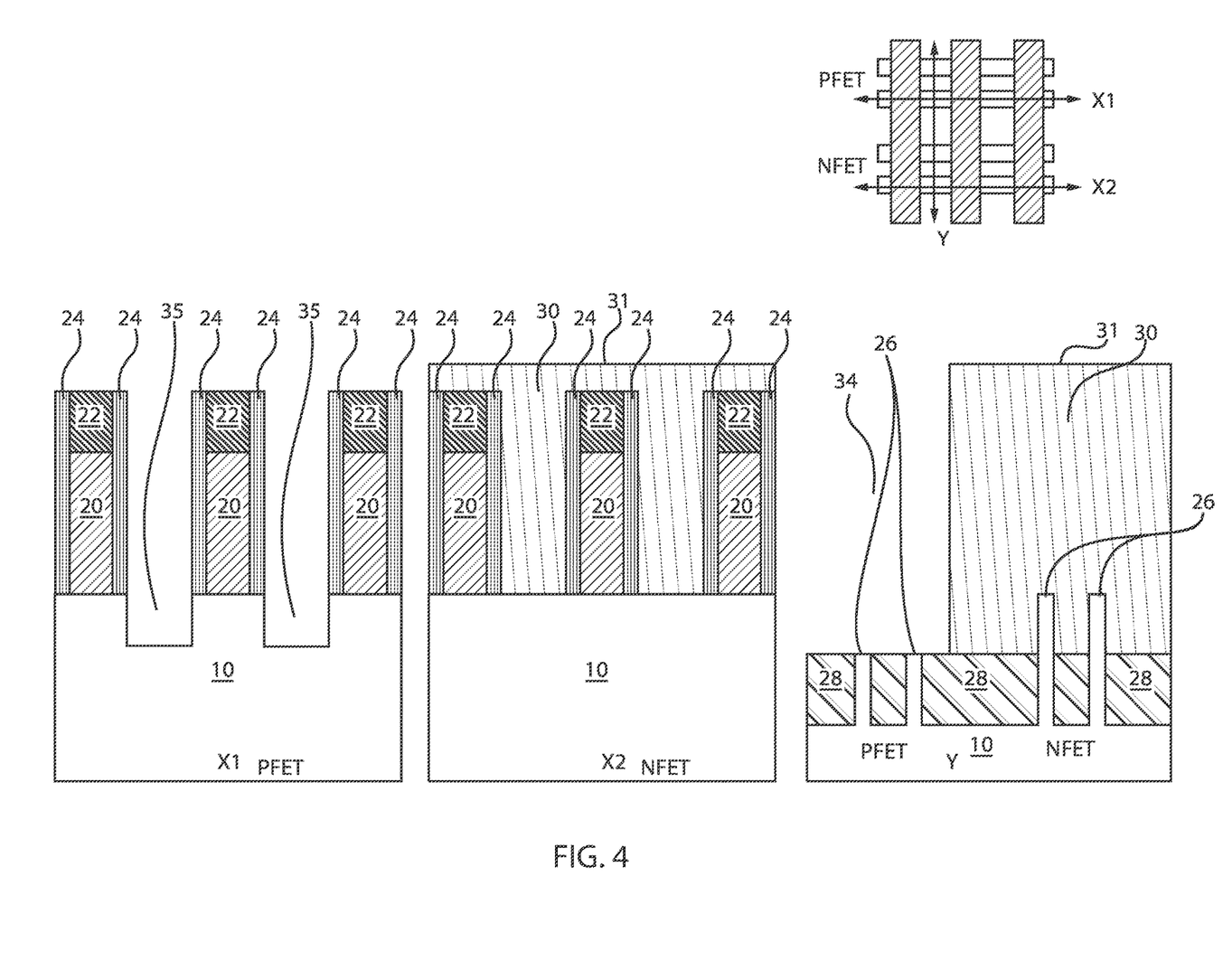
FIG. 4 is a cross-sectional view of the semiconductor structure of FIG. 3 where the exposed first set of fins in the PFET region are recessed and the first encapsulation layer in the NFET region is removed, in accordance with an embodiment of the present invention.

FIG. 4 is a cross-sectional view of the semiconductor structure of FIG. 3 where the exposed first set of fins in the PFET region are recessed and the first encapsulation layer in the NFET region is removed, in accordance with an embodiment of the present invention.

In various example embodiments, the exposed first set of fins 26 in the PFET region 34 are recessed and the first encapsulation layer 32 in the NFET region is removed.

In the view taken along axis X1, recesses or trenches 35 are formed in the substrate 10.

In the view taken along axis X2, the first encapsulation layer 32 is removed to expose a top surface 31 of the first mask 30.

In the view taken along axis Y, the first set of fins 26 in the PFET region 34 are recessed.

Figure 5:
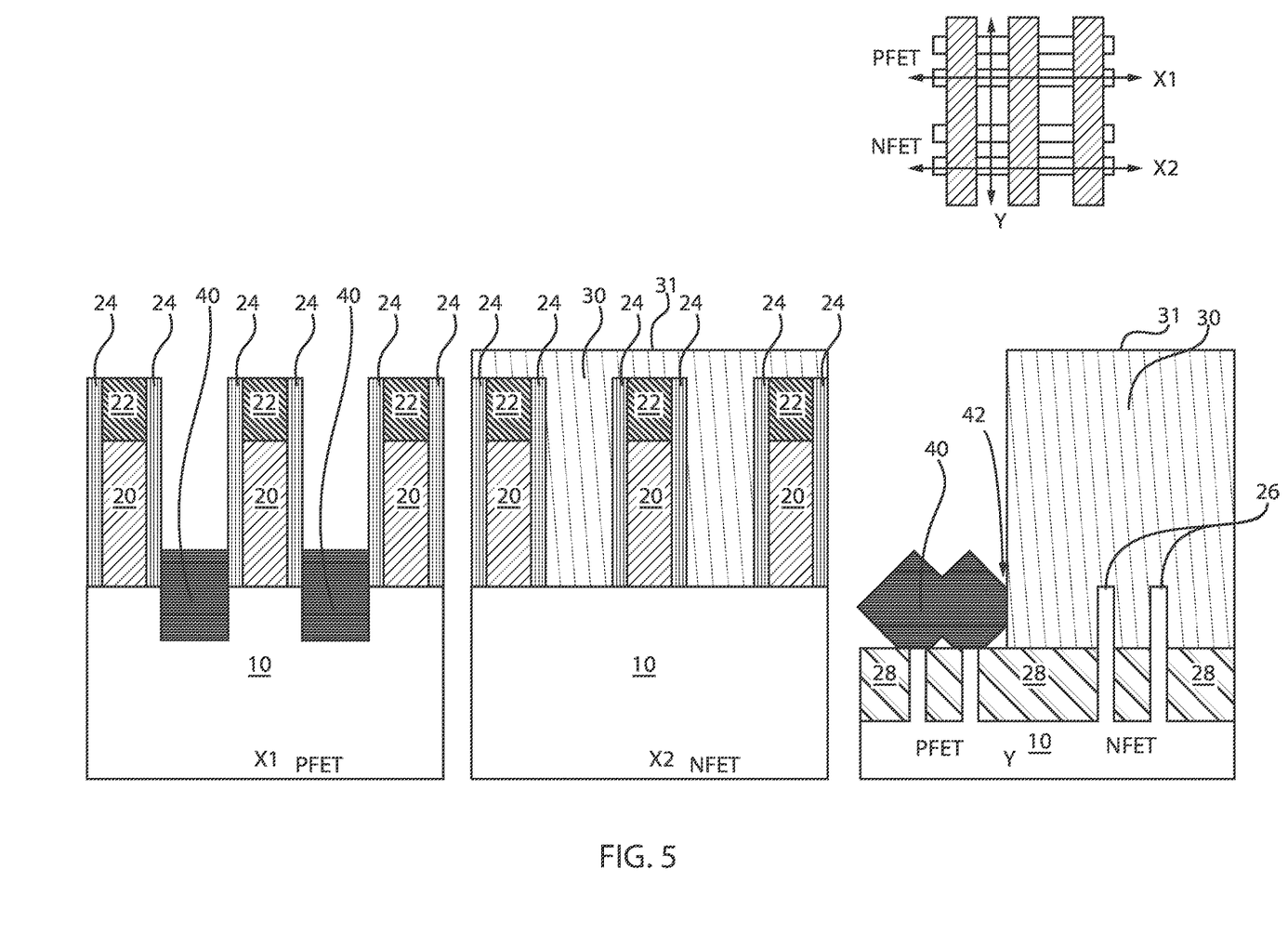
FIG. 5 is a cross-sectional view of the semiconductor structure of FIG. 4 where an epitaxial source/drain region is formed in the PFET region, in accordance with an embodiment of the present invention.

FIG. 5 is a cross-sectional view of the semiconductor structure of FIG. 4 where an epitaxial source/drain region is formed in the PFET region, in accordance with an embodiment of the present invention.

In various example embodiments, an epitaxial source/drain region 40 is formed in the PFET region 34.

In the view taken along axis X1, epitaxial growth regions are formed within the recesses or trenches 35 and between the dummy gates 20.

In the view taken along axis X2, the structure is similar to the structure in FIG. 4.

In the view taken along axis Y, the epitaxial growth 40 is formed in the PFET region 34. The epitaxial growth 40 contacts the sidewall of the first mask 30 such that the epitaxial growth 40 defines a truncated profile 42 along the sidewall of the first mask 30. The truncated profile 42 can also be referred to as a flattened face (or leveled or smoothed) or a tapered face. The edge of the first mask 30 acts as a wall or barrier that blocks or hinders the epitaxial growth 40 in the lateral direction. In other words, the edge of the first mask 30 cuts off or flattens the distal end of the epitaxial growth 40 to limit the lateral protrusion of the epitaxial growth 40. As a result, this is a growth limiting method in a horizontal direction at a scaled pitch.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 6:
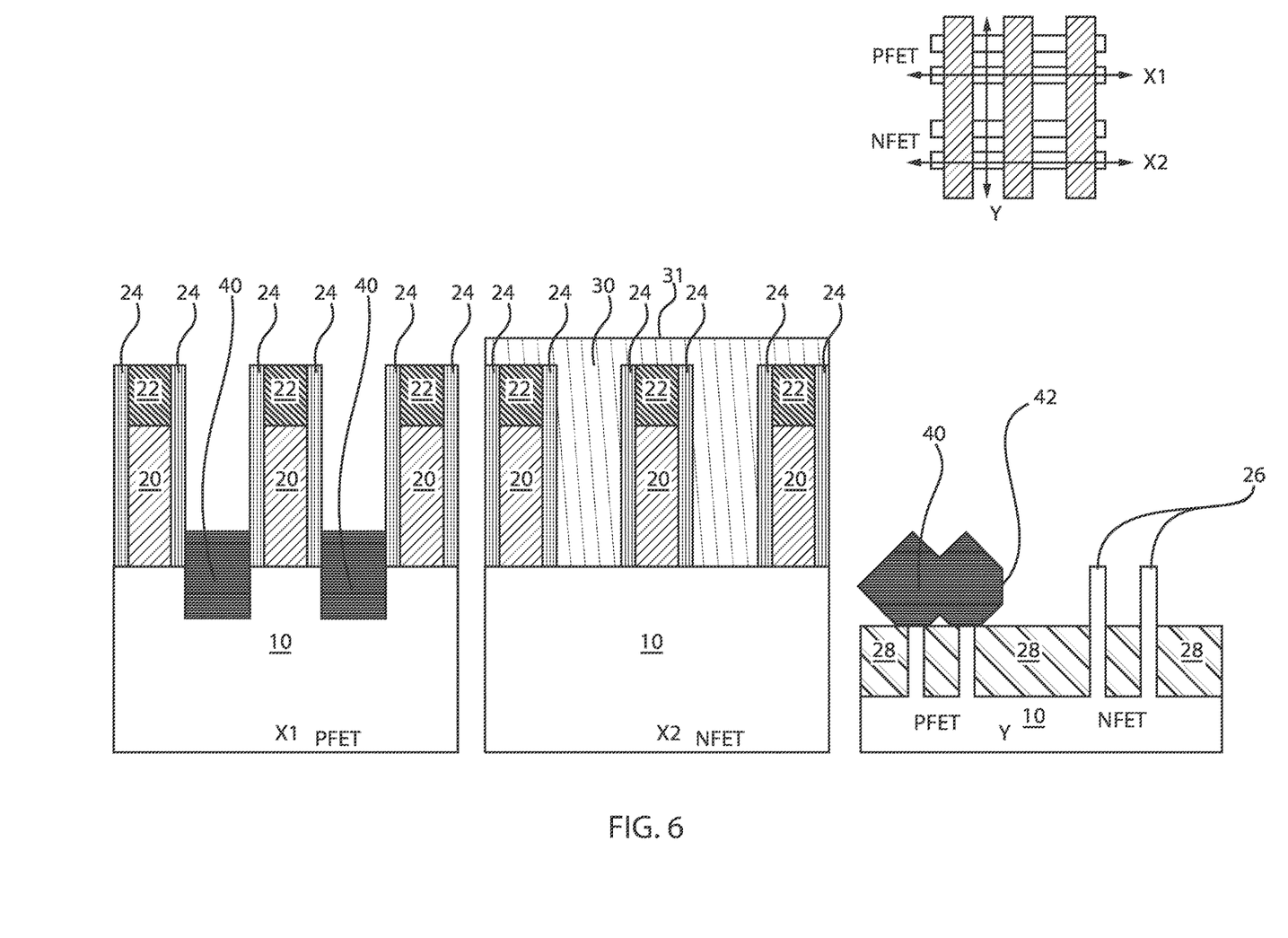
FIG. 6 is a cross-sectional view of the semiconductor structure of FIG. 5 where the first mask is removed from the NFET region, in accordance with an embodiment of the present invention.

FIG. 6 is a cross-sectional view of the semiconductor structure of FIG. 5 where the first mask is removed from the NFET region, in accordance with an embodiment of the present invention.

In various example embodiments, the first mask 30 is removed from the NFET region. The removal of the first mask 30 highlights the flattened (or leveled or smoothed) surface or tapered profile 42 of the epitaxial growth 40 in the PFET region. Moreover, the removal of the first mask 30 results in the exposure of the second set of fins 26 formed in the NFET region.

Figure 7:
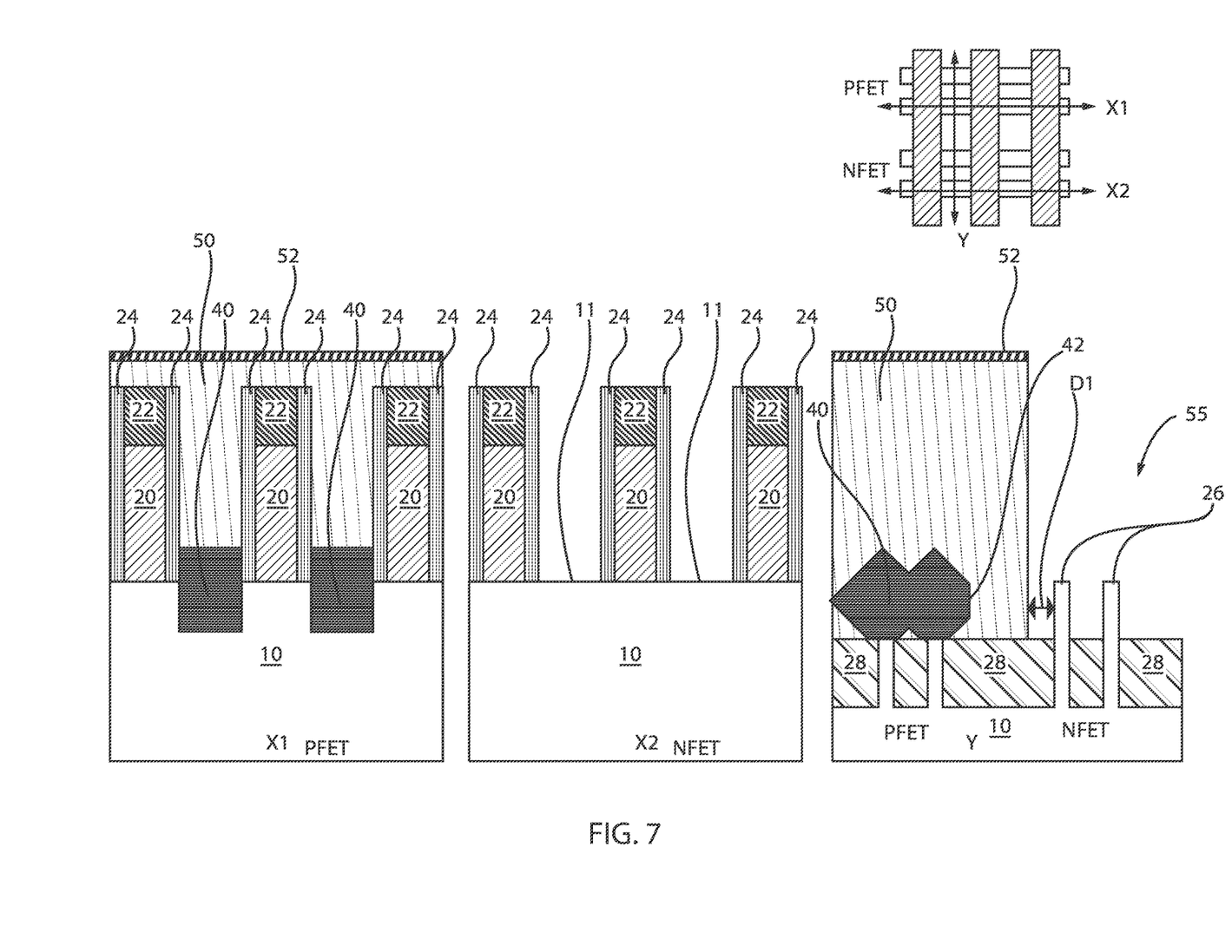
FIG. 7 is a cross-sectional view of the semiconductor structure of FIG. 6 where a second mask is deposited, a second encapsulation layer is deposited over the PFET region, and the second mask is etched in the NFET region to expose a second set of fins in the NFET region, in accordance with an embodiment of the present invention.

FIG. 7 is a cross-sectional view of the semiconductor structure of FIG. 6 where a second mask is deposited, a second encapsulation layer is deposited over the PFET region, and the second mask is etched in the NFET region to expose a second set of fins in the NFET region, in accordance with an embodiment of the present invention.

In various example embodiments, a second mask 50 is deposited, a second encapsulation layer 52 is deposited over the PFET region, and the second mask 50 is etched in the NFET region 55 to expose a second set of fins 26 in the NFET region 55.

The second mask 50 can be, e.g., a spin-on carbon (SOC) mask. The second mask 50 is a patterning material that can be removed by, e.g., an ash process. Additionally, the second mask 50 is compatible with high temperature processes, such as epitaxy.

The second encapsulation layer 52 can be, e.g., a titanium oxide ($TiO_x$) layer.

In the view taken along axis X1, the second encapsulation layer 52 is shown over the second mask 50.

In the view taken along axis X2, the spacers 24 are exposed, as well as a top surface 11 of substrate 10 due to the etching in the NFET region.

In the view taken along axis Y, the second set of fins 26 in the NFET region 55 are exposed. The leftmost fin of the second set of fins 26 is separated from the second mask 50 in the PFET region by a distance "D1." The distance "D1" can be about 8 nm to about 16 nm.

Figure 8:
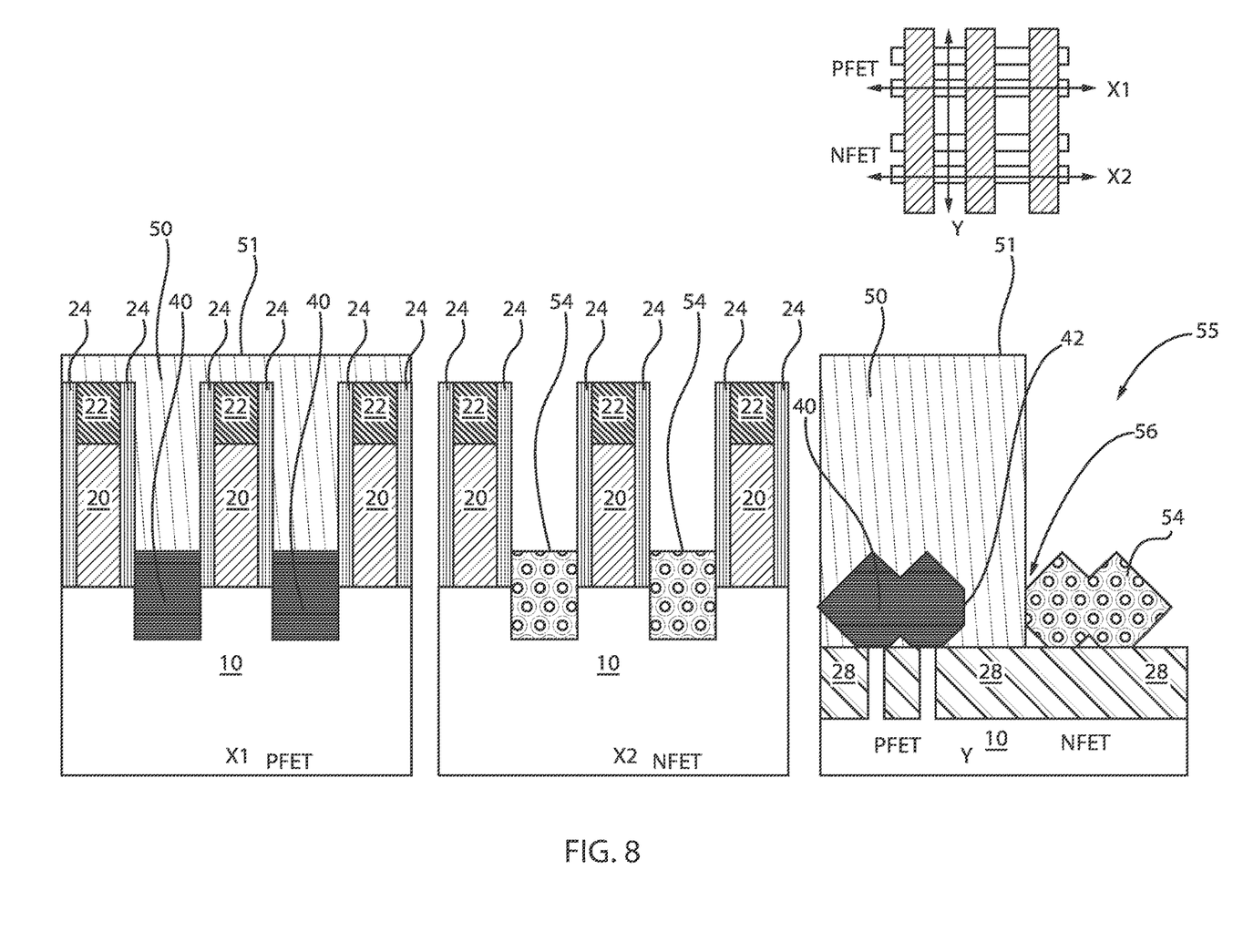
FIG. 8 is a cross-sectional view of the semiconductor structure of FIG. 7 where the exposed second set of fins in the NFET region are recessed, the second encapsulation layer in the PFET region is removed, and an epitaxial source/drain region is formed in the NFET region, in accordance with an embodiment of the present invention.

FIG. 8 is a cross-sectional view of the semiconductor structure of FIG. 7 where the exposed second set of fins in the NFET region are recessed, the second encapsulation layer in the PFET region is removed, and an epitaxial source/drain region is formed in the NFET region, in accordance with an embodiment of the present invention.

In various example embodiments, the second set of fins 26 in the NFET region 55 are recessed, the second encapsulation layer 52 in the PFET region is removed, and an epitaxial source/drain region 54 is formed in the NFET region 55.

In the view taken along axis X1, the second encapsulation layer 52 is removed to expose a top surface 51 of the second mask 50.

In the view taken along axis X2, recesses or trenches are formed in the substrate 10 and then filled with the epitaxial source/drain region 54.

In the view taken along axis Y, the second set of fins 26 in the NFET region 55 are recessed and the epitaxial source/drain region 54 is deposited.

The epitaxial growth 54 contacts the sidewall of the second mask 50 such that the epitaxial growth 54 defines a truncated profile 56 along the sidewall of the second mask 50. The truncated profile 56 can also be referred to as a flattened (or leveled or smoothed) face or a tapered face. The edge of the second mask 50 acts as a wall or barrier that blocks or hinders the epitaxial growth 54 in the lateral direction. In other words, the edge of the second mask 50 cuts off or flattens the distal end of the epitaxial growth 54 to limit the lateral protrusion of the epitaxial growth 54. As a result, this is a growth limiting method in a horizontal direction at a scaled pitch.

Figure 9:
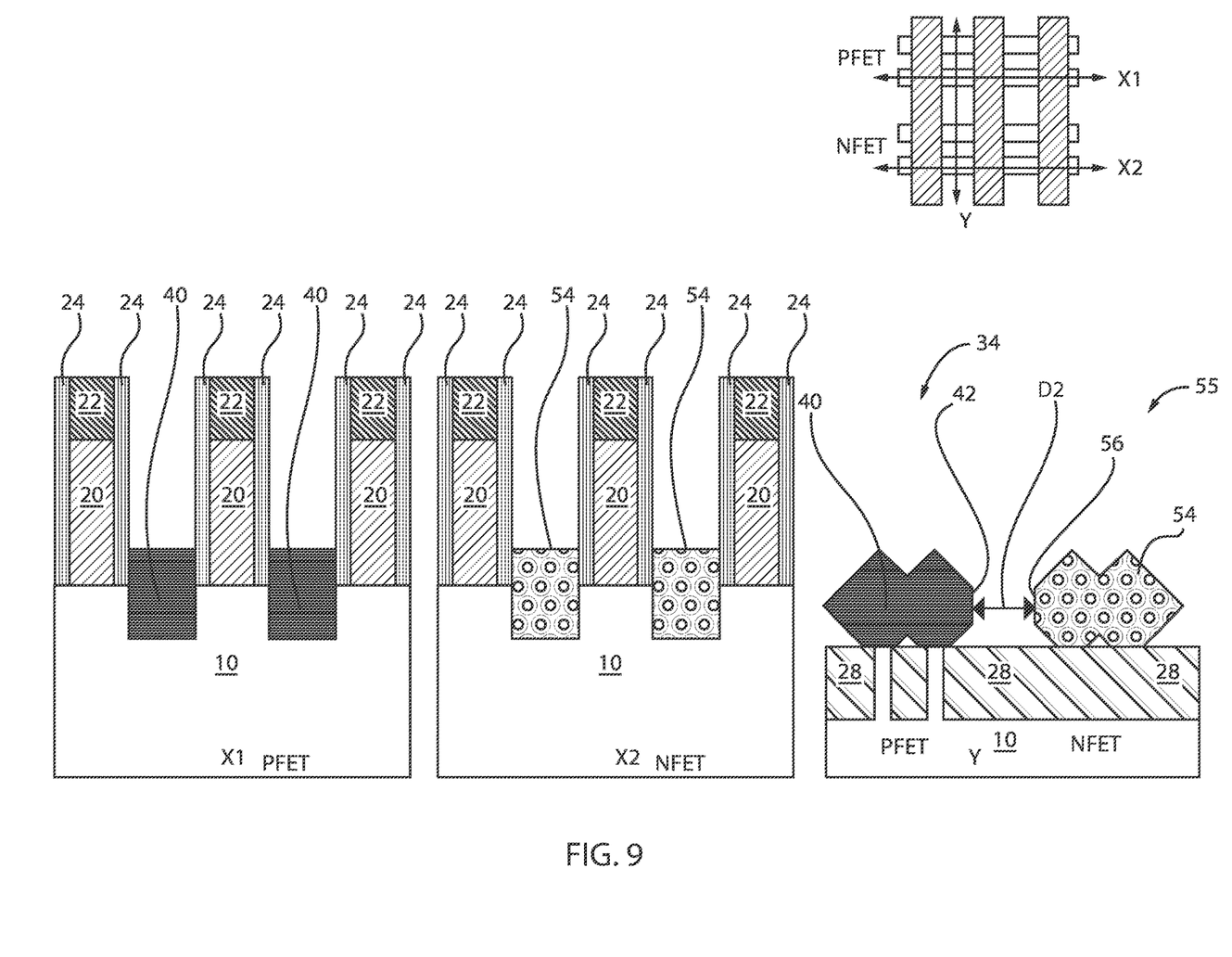
FIG. 9 is a cross-sectional view of the semiconductor structure of FIG. 8 where the second mask is removed from the PFET region, in accordance with an embodiment of the present invention.

FIG. 9 is a cross-sectional view of the semiconductor structure of FIG. 8 where the second mask is removed from the PFET region, in accordance with an embodiment of the present invention.

In various example embodiments, the second mask 50 is removed from the NFET region 55. The removal of the second mask 50 highlights the flattened (or leveled or smoothed) surface or tapered profile 56 of the epitaxial growth 54 in the NFET region.

The distance "D2" between the flattened surface 42 of the epitaxial growth 40 formed in the PFET region and the flattened surface 56 of the epitaxial growth 54 formed in the NFET region can be, e.g., between about 8 nm and 24 nm. The faces of the flat surfaces 42, 56 can be substantially perpendicular to the top surface of the substrate 10.

Therefore, the distance between the epitaxial growths 40 and 54 is maximized or expanded or widened or increased such that epitaxy to epitaxy shorts are reduced or eliminated. In other words, lateral epitaxial growth can be decreased (for each individual growth) in order to create larger epitaxy to epitaxy spacing between epitaxial growths.

In one embodiment, the first epitaxial source/drain regions 40 extend over an entire upper surface of the PFET region 34 and the second epitaxial source/drain regions 54 extend over an entire upper surface of the NFET region 55.

Figure 10:
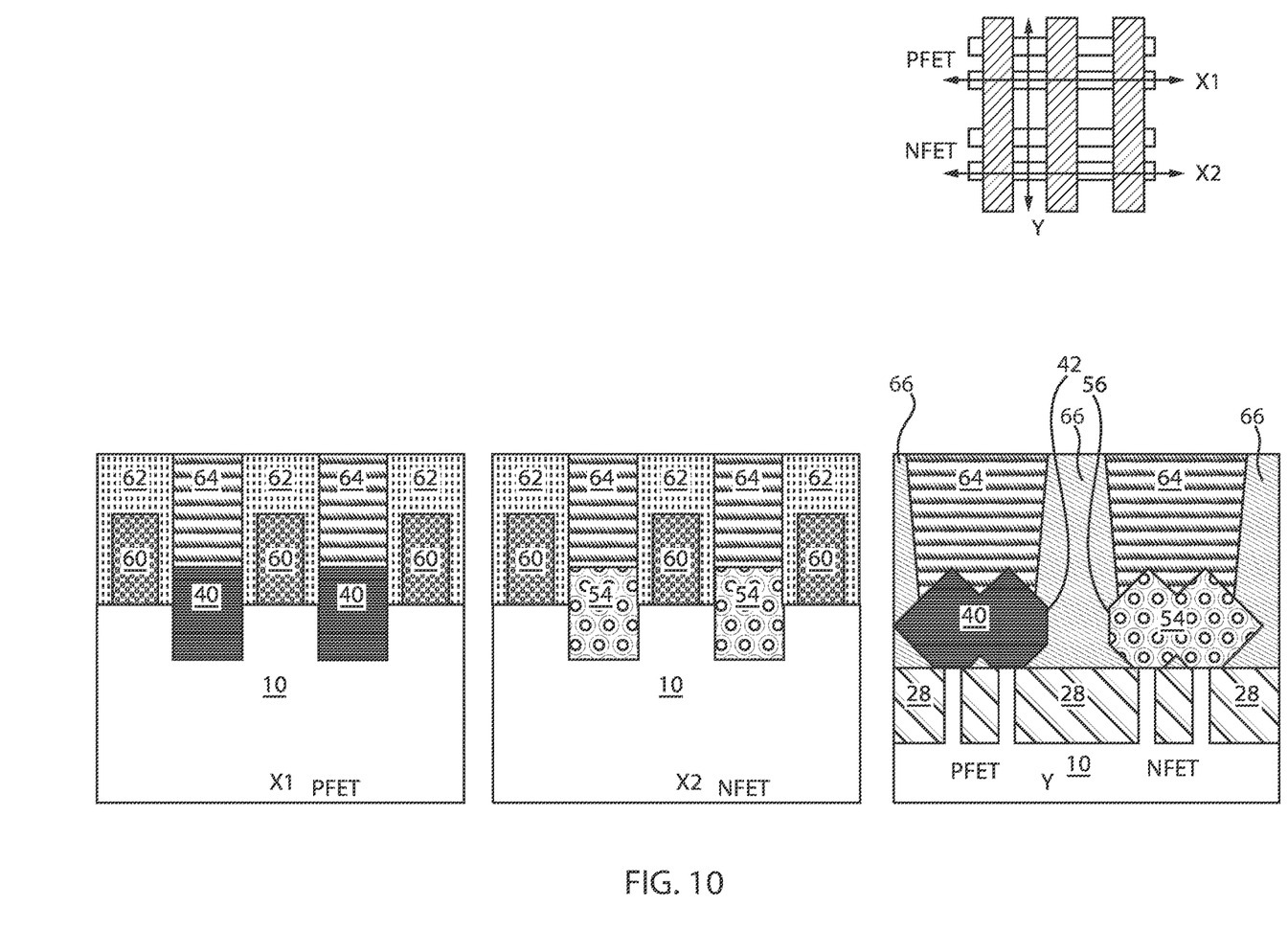
FIG. 10 is a cross-sectional view of the semiconductor structure of FIG. 9 where the dummy gates are removed and replaced with a high-k metal gate (HKMG), and a metal fill takes place over the epitaxial source/drain regions, in accordance with an embodiment of the present invention.

FIG. 10 is a cross-sectional view of the semiconductor structure of FIG. 9 where the dummy gates are removed and replaced with a high-k metal gate (HKMG), and a metal fill takes place over the epitaxial source/drain regions, in accordance with an embodiment of the present invention.

In various example embodiments, the dummy fins 20 are removed and a high-k metal gate (HKMG) 60 is formed therein between the spacers 24. Dielectrics 62, 66 can be deposited and metallization 64 can take place over the epitaxial growth 40 in the PFET region 34 and the epitaxial growth 54 in the NFET region 55.

In various embodiments, the HKMG 60 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Dielectrics 62, 66 can be an inter-layer dielectric (ILD). The ILD 62 can be selected from the group consisting of silicon containing materials such as $SiO_2$, $Si_3N_4$, $SiO_xN_y$, SiC, SiCO, SiCOH, and SiCH compounds.

In various exemplary embodiments, metallization includes depositing conductive material 64. The conductive material 64 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The conductive material 64 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 64 can be reduced by chemical-mechanical polishing (CMP) and/or etching. Therefore, the planarization process can be provided by CMP. Other planarization process can include grinding and polishing.

In summary, the exemplary embodiments of the present invention pertain to a method and structure of employing an SOC mask, rather than a dielectric liner, as an NFET and PFET source/drain epitaxy separating medium. The separating medium or SOC mask physically limits the lateral protrusion of the respective epitaxy into the neighboring area and eliminates the possibility for epitaxy to epitaxy shorts. Thus, the epitaxy to epitaxy spacing can be enlarged to prevent epitaxy shorts. This scheme can be used in FinFETs, as well as in nanosheet technology and at other CMOS integration flows where tight dimensions demand close S/D epitaxy.

Therefore, a structure and/or method of forming a semiconductor structure includes masking an NFET region of a semiconductor substrate with a first mask, forming epitaxial source/drain regions in a PFET region, wherein the first mask limits the lateral growth of the epitaxial source/drain regions in the PFET region toward the NFET region followed by masking the PFET region of the semiconductor substrate with a second first mask, forming epitaxial source/drain regions in the NFET region, wherein the second mask limits the lateral growth of the epitaxial source/drain regions in the NFET region toward the PFET region. The limited epitaxial lateral growth for each of the NFET and the PFET regions results in a truncated or flattened face of the epitaxy (or epi) where the face is substantially perpendicular to the top surface of the substrate. The NFET and/or the PFET transistor regions are formed using nanosheet technology. The truncated surface can also be referred to as an indent, which is a cut or a notch.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for confined source drain epitaxy to eliminate or reduce shorts in complementary metal oxide semiconductor (CMOS) integrated circuits (ICs) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for limiting lateral protrusion of neighboring epitaxial growths, the method comprising:
   masking an n-type field effect transistor (NFET) region of a semiconductor substrate with a first mask;
   forming first epitaxial source/drain regions in a p-type field effect transistor (PFET) region, where the first mask limits lateral growth of the first epitaxial source/drain regions in the PFET region toward the NFET region;
   masking the PFET region of the semiconductor substrate with a second mask; and
   forming second epitaxial source/drain regions in the NFET region, where the second mask limits lateral growth of the second epitaxial source/drain regions in the NFET region toward the PFET region,
   wherein a truncated surface of the first epitaxial source/drain regions faces a truncated surface of the second epitaxial source/drain regions.

2. The method of claim 1, wherein the first mask and the second mask are spin-on carbon (SOC) masks.

3. The method of claim 1, wherein the truncated surface on the first epitaxial source/drain regions directly contacts a sidewall of the first mask and the truncated surface on the second epitaxial source/drain regions directly contacts a sidewall of the second mask.

4. The method of claim 1, wherein the truncated surfaces of the first and second epitaxial source/drain regions are perpendicular to the semiconductor substrate.

5. The method of claim 1, wherein the first epitaxial source/drain regions extend over an entire upper surface of the PFET region and the second epitaxial source/drain regions extend over an entire upper surface of the NFET region.

6. The method of claim 1, wherein a distance between the first mask and a nearest fin in the PFET region is about 8 nm to about 16 nm.

7. The method of claim 1, wherein a distance between the second mask and a nearest fin in the NFET region is about 8 nm to about 16 nm.

8. The method of claim 1, wherein a distance between the truncated surface on the first epitaxial source/drain regions and the truncated surface on the second epitaxial source/drain regions is about 8 nm to about 24 nm.

9. The method of claim 1, further comprising depositing a conductive material over and in direct contact with the first and second epitaxial source/drain regions.

10. A method for increasing epitaxy to epitaxy spacing, the method comprising:
   depositing a first spin-on carbon (SOC) mask over an n-type field effect transistor (NFET) region of a semiconductor substrate;
   recessing a first set of fins in the p-type field effect transistor (PFET) region;
   growing first epitaxial source/drain regions over the PFET region such that a distal end of the first epitaxial source/drain regions defines a flattened surface resulting from contact with the first SOC mask;
   removing the first SOC mask;
   depositing a second SOC mask over PFET region of the semiconductor substrate;
   recessing a second set of fins in the NPFET region;
   growing second epitaxial source/drain regions over the NFET region such that a distal end of the second epitaxial source/drain regions defines a flattened surface resulting from contact with the second SOC mask; and
   removing the second SOC mask.

11. The method of claim 10, wherein the flattened surfaces of the first and second epitaxial source/drain regions are perpendicular to the semiconductor substrate.

12. The method of claim 10, wherein the first epitaxial source/drain regions extend over an entire upper surface of the PFET region and the second epitaxial source/drain regions extend over an entire upper surface of the NFET region.

13. The method of claim 10, wherein a distance between the first SOC mask and a nearest fin in the PFET region is about 8 nm to about 16 nm.

14. The method of claim 10, wherein a distance between the second SOC mask and a nearest fin in the NFET region is about 8 nm to about 16 nm.

15. The method of claim 10, wherein a distance between the flattened surface on the first epitaxial source/drain regions and a flattened surface on the second epitaxial source/drain regions is about 8 nm to about 24 nm.

16. The method of claim 10, further comprising depositing a conductive material over and in direct contact with the first and second epitaxial source/drain regions.

* * * * *